(12) United States Patent
Barton et al.

(10) Patent No.: US 11,469,706 B2
(45) Date of Patent: Oct. 11, 2022

(54) COLOR NEUTRAL SOLAR PHOTOVOLTAIC WINDOW

(71) Applicant: Omega Optical LLC, Brattleboro, VT (US)

(72) Inventors: John B. Barton, Brattleboro, VT (US); Gary E. Carver, Wilmington, VT (US); Sheetal K. Chanda, Swanzey, NH (US); Robert L. Johnson, Jr., Brattleboro, VT (US); Sarah A. Locknar, Woodstock, VT (US)

(73) Assignee: Omega Optical LLC, Brattleboro, VT (US)

( * ) Notice: Subject to any disclaimer, the term of this patent is extended or adjusted under 35 U.S.C. 154(b) by 102 days.

(21) Appl. No.: 17/021,970

(22) Filed: Sep. 15, 2020

(65) Prior Publication Data
US 2022/0085749 A1 Mar. 17, 2022

(51) Int. Cl.
*H02S 20/26* (2014.01)
*H01L 51/44* (2006.01)
(Continued)

(52) U.S. Cl.
CPC .............. *H02S 20/26* (2014.12); *E06B 9/24* (2013.01); *H01L 31/0549* (2014.12);
(Continued)

(58) Field of Classification Search
CPC ............ H02S 20/26; E06B 2009/2476; H01L 51/4213; H01L 31/0488; H01L 31/0468
See application file for complete search history.

(56) References Cited

U.S. PATENT DOCUMENTS

2016/0141535 A1* 5/2016 Snaith ................ H01L 51/0032
136/263
2017/0089128 A1* 3/2017 Wheeler .................. C03C 4/06
(Continued)

OTHER PUBLICATIONS

Y. Jiang, et al., "Efficiency colorful perovskite solar cells using a top polymer electrode simultaneously as spectrally selective antiflection coating", Nano Letters 16, p. 7829-7835 (Year: 2016).*
(Continued)

*Primary Examiner* — Ryan S Cannon
(74) *Attorney, Agent, or Firm* — Jonathan B. David

(57) ABSTRACT

A system can comprise a first window pane configured at a first position in a semitransparent and uniform structure. The system can also include a first substrate configured with a first transparent conductive oxide (TCO) contact layer, a hole transport (HTL) layer and a first perovskite layer, wherein the first TCO contact layer, the HTL layer, and first perovskite layer are positioned at a set distance away from the first window pane in the semitransparent and uniform structure. The HTL layer includes oxides, or iodides, or organic materials. Further, the system can include a second substrate directly opposite to the first substrate, and configured with a second TCO contact layer, an electron transport (ETL) layer, and a second perovskite layer, wherein the first perovskite layer and the second perovskite layer are fused together in the semitransparent and uniform structure. The ETL layer includes oxides or organic materials. In addition, the system can include a second window pane configured at a second position, wherein the second window pane is configured directly opposite to the first window pane, and around the first and second substrate in the semitransparent and uniform structure.

20 Claims, 12 Drawing Sheets

(51) Int. Cl.
*E06B 9/24* (2006.01)
*H01L 51/42* (2006.01)
*H01L 31/054* (2014.01)

(52) U.S. Cl.
CPC ........ *H01L 51/4213* (2013.01); *H01L 51/442* (2013.01); *E06B 2009/2476* (2013.01)

(56) References Cited

U.S. PATENT DOCUMENTS

| | | | |
|---|---|---|---|
| 2018/0301578 A1* | 10/2018 | Rozbicki | H02S 20/22 |
| 2019/0267933 A1* | 8/2019 | Janowski | H01L 31/02008 |
| 2020/0294728 A1* | 9/2020 | Zhu | H01L 51/4253 |
| 2020/0343053 A1* | 10/2020 | Lunt | H01L 51/42 |
| 2021/0143350 A1* | 5/2021 | Irwin | H01L 51/4213 |

OTHER PUBLICATIONS

K-T. Lee, L. J. Guo, H. J. Park, "Neutral-and multi-colored semi-transparent perovskite solar cells", Molecules 21, 475 (Year: 2016).*
Colored, see-through perovskite solar cells employing an optical cavity, Journals of Materials Chemistry C 3, p. 5377-5382 (Year: 2015).*
J-H. Lu et al., "High-performance, semitransparent, easily tunable vivid colorful perovskite photovoltaics featuring Ag/ITO/Ag microcavity structures", Journal of Physical Chemistry C 120, p. 4233-4239 (Year: 2016).*

* cited by examiner

COLOR NEUTRAL SOLAR PHOTOVOLTAIC WINDOW

TECHNICAL FIELD

The present disclosure generally relates to a solar window system. More specifically, the present invention provides a solar window system for generating electrical power and providing transmission and reflection neutrality of incident light.

BACKGROUND

Energy efficiency initiatives encourage reducing the heat loss from buildings during the winter and minimizing heat load into buildings during the summer. Windows with tint and/or low-E coatings to transmit part of the visible light and reflect most of the infrared light can reduce heat loss during the winter and minimize heat load during the summer.

In many conventional windows, tinting limits the transmittance of visible light to within the range of 10% to 50%. The transmittance is much lower for wavelengths outside of the visible region. Conventional windows can provide many aspects of a solar window for free. These aspects can include glass panes, edge seals, low-E coatings, land, installation, shipping and cleaning. However, a portion of light incident on conventional windows with a conventional window tint is blocked due to reflection or absorption. Conventional windows typically do not generate power from the light that is blocked by the window tint.

Power from solar windows can be significant. One of the major necessities of a solar cell within a solar window is to be partially transparent in the visible region. The solar cell should be partially transparent in the visible region in the 10% to 50% range. The solar cell should also convert the rest of the visible spectrum into electrical power instead of blocking the light. Further, the solar cell should also absorb or reflect the infrared (IR) region of the spectrum. In addition, the transmission of the solar window should appear color neutral to an observer looking through the window.

Therefore, it is imperative to have a solar cell within a solar window system that enables the solar window to have color neutrality of the transmission of incident light to an observer looking from the inside of the building at the solar window, and reflection of incident light to observers of the solar window observing from the outside of the building. In addition, the solar window should be partially transparent in the visible spectrum. In addition, the solar window should be able to generate electrical power from incident light that would otherwise be blocked by the window tint of a conventional window.

SUMMARY

An embodiment relates to a system comprising: a first window pane configured at a first position in a semitransparent and uniform structure. The system may also include a first substrate configured with a first transparent conductive oxide (TCO) contact layer, a hole transport (HTL) layer and a first perovskite layer, wherein the first TCO contact layer, the HTL layer and the first perovskite layer are positioned at a set distance away from the first window pane in the semitransparent and uniform structure. The HTL layer includes oxides, or iodides, or organic materials. In addition, the system can include a second substrate directly opposite to the first substrate, and configured with a second TCO contact layer, an electron transport (ETL) layer, and a second perovskite layer, wherein the first perovskite layer and the second perovskite layer are fused together in the semitransparent and uniform structure. The ETL layer includes oxides or organic materials. Further, the system may include a second window pane configured at a second position, wherein the second window pane is configured directly opposite to the first window pane, and around the first and second substrate in the semitransparent and uniform structure.

The first TCO contact layer, the HTL layer, the first perovskite layer, the second TCO contact layer, the ETL layer, and the second perovskite layer are configured to collectively act as an interference filter.

The first and second TCO contact layers, the HTL layer, and the ETL layer provide a hermetic seal to the first perovskite layer and the second perovskite layer.

The first and second substrate are sealed by laser glass-to-glass welding and/or polyisobutylene (PIB) sealing.

An embodiment relates to a system comprising: a first transparent conductive oxide (TCO) contact layer deposited within a semitransparent and uniform structure in a first position. A hole transport (HTL) layer configured within the semitransparent and uniform structure, wherein the HTL layer is configured on the first TCO contact layer. The HTL layer includes oxides, or iodides, or organic materials. The system may also include a first perovskite layer configured on the HTL layer in the semitransparent and uniform structure. Further, the system can include a second TCO contact layer deposited on the semitransparent and uniform structure in a second position. The system can also include an electron transport (ETL) layer positioned within the semitransparent and uniform structure, wherein the ETL layer is configured directly opposite to the HTL layer and in contact with the second TCO contact layer. The ETL layer includes oxides or organic materials. In addition, the system can include a second perovskite layer positioned on the ETL layer, wherein the second perovskite layer is fused together with the first perovskite layer in the semitransparent and uniform structure, wherein the first and second TCO contact layers, the HTL and ETL layers, and the first and second perovskite layers are configured on a first and second substrate, and wherein the first and second substrate are sealed by laser glass-to-glass welding and/or polyisobutylene (PIB) sealing.

The first and second TCO contact layers, the HTL and ETL layers, and the first and second perovskite layer collectively provide color neutrality with transmission and reflection of incident light and generate electrical power from incident light.

At least one of the outer window panes are configured to prevent ultraviolet (UV) damage to the HTL and ETL layers and the first and second perovskite layer.

The HTL layer can preferably be made of Nickel Oxide and the ETL layer can preferably be made of Tin Oxide.

A plurality of gaps are filled with argon and configured around the first perovskite layer and the second perovskite layer, wherein the plurality of argon gaps are not configured within a solar cell in the semitransparent and uniform structure.

A method can include positioning a first window pane at a first position in a semitransparent and uniform structure. The method may also include configuring a first substrate with a first transparent conductive oxide (TCO) contact layer, a hole transport (HTL) layer and a first perovskite layer, wherein the first TCO contact layer, the HTL layer, and the first perovskite layer are positioned at a set distance away from the first window pane in the semitransparent and uniform structure. The HTL layer may include oxides, or iodides, or organic materials. Further, the method may include positioning a second substrate with a second TCO contact layer, an electron transport (ETL) layer, and a second perovskite layer, wherein the second perovskite layer is fused together with the first perovskite layer within the semitransparent and uniform structure. The ETL layer may include oxides or organic materials. In addition, the method may include configuring a second window pane at a second position, wherein the second window pane is configured directly opposite to the first window pane, and around the first and second substrate in the semitransparent and uniform structure, and wherein the first and second substrate are sealed by laser glass-to-glass welding and/or polyisobutylene (PIB) sealing.

The first and second TCO contact layers, the HTL layer, and the ETL layer provide a hermetic seal to protect the first perovskite layer and the second perovskite layer from outside humidity.

An outer surface of the first substrate and an outer surface of the second substrate are coated to protect the first and second perovskite layer from ultraviolet (UV) damage.

One or more metal runners are configured on the first and second substrate to assist in transferring a charge to one or more external contacts in the semitransparent and uniform structure.

Other contemplated embodiments can include objects, features, aspects, and advantages in addition to or in place of those mentioned above. These objects, features, aspects, and advantages of the embodiments will become more apparent from the following detailed description, along with the accompanying drawings.

BRIEF DESCRIPTION OF THE FIGURES

The solar window system is illustrated in the figures of the accompanying drawings which are meant to be exemplary and not limiting, in which like reference numerals are intended to refer to like components, and in which.

Figure 1:
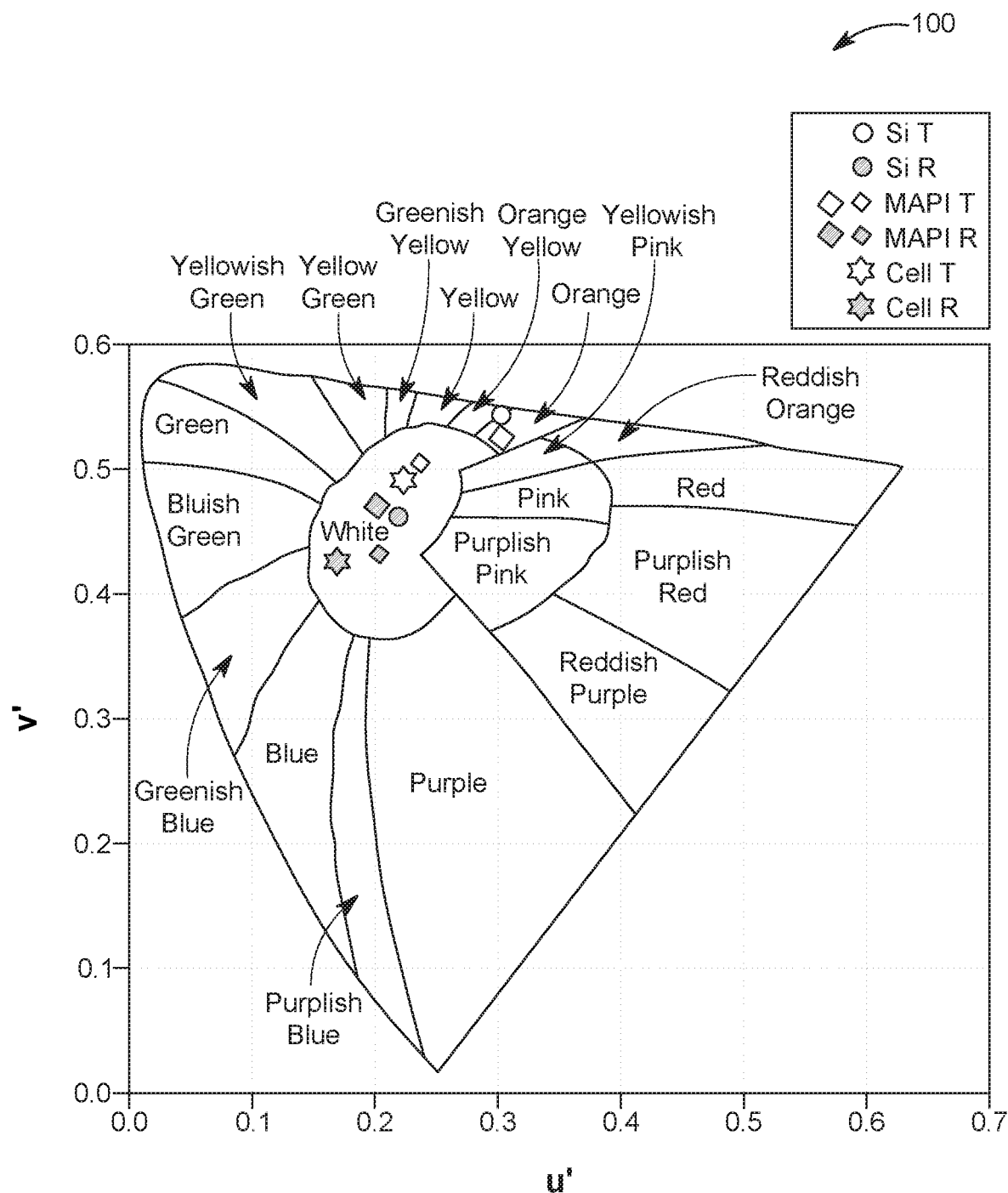
FIG. 1 illustrates a chromaticity chart in accordance with an embodiment of the presently disclosed embodiments.

Unless otherwise indicated illustrations in the figures are not necessarily drawn to scale.

DETAILED DESCRIPTION OF SOME EMBODIMENTS

Background and Context

The disclosed embodiments are best understood by reference to the Figures and detailed description herein.

Disclosed embodiments of the invention are discussed below with reference to the Figures. However, those skilled in the art will appreciate that the detailed description provided herein with respect to these figures is for explanatory purposes as the invention may extends beyond these currently disclosed embodiments. Various alternate approaches to implement the functionality of any given detail described herein are envisioned. That is, there are modifications and variations of the invention that are too numerous to be listed but that all fit within the scope of the invention. Also, singular words should be read as plural and vice-versa, where appropriate, and alternative embodiments do not imply mutual exclusivity.

It is to be further understood that the disclosed embodiments are not necessarily limited to the particular methodology, techniques, uses, and applications, described herein, as these may vary. It is also to be understood that the terminology used herein is used for the purpose of describing particular embodiments only, and is not otherwise intended to limit the scope of the present invention. It must be noted that as used herein in the detailed description and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Physical and/or conceptual structures described herein are to be understood also to refer to functional equivalents of such structures.

All words of approximation as used in the present disclosure and claims should be construed to mean "approximate," rather than "perfect". Words of approximation, include, yet are not limited to terms such as "substantial", "nearly", "almost", "about", "generally", "largely", etc.

Terms of degree are not necessarily indefinite. "Claim language employing terms of degree has long been found definite where it provided enough certainty to one of skill in the art when read in the context of the invention." *Interval Licensing LLC v. AOL, Inc.*, 766 F.3d 1364, 1370, 112 USPQ2d 1188, 1192-93 (Fed. Cir. 2014) (citing *Eibel Process Co. v. Minnesota & Ontario Paper Co.*, 261 U.S. 45, 65-66 (1923. Thus, when a term of degree is used in the claim, the examiner should determine whether the specification provides some standard for measuring that degree. *Hearing Components, Inc. v. Shure Inc.*, 600 F.3d 1357, 1367, 94 USPQ2d 1385, 1391 (Fed. Cir. 2010); *Enzo Biochem, Inc., v. Applera Corp.*, 599 F.3d 1325, 1332, 94 USPQ2d 1321, 1326 (Fed. Cir. 2010); *Seattle Box Co., Inc. v. Indus. Crating & Packing, Inc.*, 731 F.2d 818, 826, 221 USPQ 568, 574 (Fed. Cir. 1984).

The term "substantially" is often used in conjunction with another term to describe a particular characteristic of the claimed invention. It is a broad term. In re *Nehrenberg*, 280 F.2d 161, 126 USPQ 383 (CCPA 1960). The court held that the limitation "to substantially increase the efficiency of the compound as a copper extractant" was definite in view of the general guidelines contained in the specification. In re *Mattison,* 509 F.2d 563, 184 USPQ 484 (CCPA 1975).

All questions of enablement are evaluated against the claimed subject matter. The focus of the examination inquiry is whether everything within the scope of the claim is enabled.

Unless defined otherwise, all technical and scientific terms used herein have the same meanings as commonly understood by one of ordinary skill in the art to which the disclosed embodiments belong. Preferred methods, techniques, devices, and materials are described, although any methods, techniques, devices, or materials similar or equivalent to those described herein may be used in the practice or testing of the present invention.

Although claims have been included in this Application to specific enumerated combinations of features, it should be understood that the scope of the present disclosure also includes any novel feature or any novel combination of features disclosed herein.

References "an embodiment," "example embodiment," "various embodiments," "some embodiments," etc., may indicate that the embodiment(s) so described may include a particular feature, structure, or characteristic, but not every possible embodiment necessarily includes that particular feature, structure, or characteristic.

References to "person", "individual", "human", "a party", or any similar term, as used herein, it should be understood that such references are sole by way of example Headings provided are for convenience and are not to be taken as limiting the present disclosure in any way.

Each term utilized herein is to be given its broadest interpretation given the context in which that term is utilized.

Terminology

The following paragraphs provide context for terms found in the present disclosure (including the claims):

The transitional term "comprising", which is synonymous with "including," "containing," or "characterized by," is inclusive or open-ended and does not exclude additional, unrecited elements or method steps. See, e.g., *Mars Inc.* v. *H. J. Heinz Co.,* 377 F.3d 1369, 1376, 71 USPQ2d 1837, 1843 (Fed. Cir. 2004) ("[L]ike the term 'comprising,' the terms 'containing' and 'mixture' are open-ended."). "Configured to" or "operable for" is used to connote structure by indicating that the mechanisms/units/components include structure that performs the task or tasks during operation. "Configured to" may include adapting a manufacturing process to fabricate components that are adapted to implement or perform one or more tasks.

"Based On." As used herein, this term is used to describe factors that affect a determination without otherwise precluding other or additional factors that may affect that determination. More particularly, such a determination may be solely "based on" those factors or based, at least in part, on those factors.

All terms of example language (e.g., including, without limitation, "such as", "like", "for example", "for instance", "similar to", etc.) are not exclusive of other examples and therefore mean "by way of example, and not limitation . . . ".

A description of an embodiment having components in communication with each other does not infer that all enumerated components are needed.

A commercial implementation in accordance with the scope and spirit of the present disclosure may be configured according to the needs of the particular application, whereby any functions of the teachings related to any described embodiment of the present invention may be suitably changed by those skilled in the art.

The example embodiments described herein can be implemented in a solar window system to provide color neutral transmission and reflection of incident light, generate electrical power from incident light, and be partially transparent in the visible region of the spectrum.

Aspects of the present invention are described below with reference to flowchart illustrations and/or block diagrams of methods, and systems according to the disclosed embodiments. Each block of the flowchart illustrations and/or block diagrams, and combinations of blocks in the flowchart illustrations and/or block diagrams, can be implemented by various means.

The flowchart and block diagrams in the figures illustrate the architecture, functionality, and operation of possible implementations of systems and methods according to various embodiments. In this regard, each block in the flowchart or block diagrams may represent a segment which comprises one or more executable instructions for implementing the specified logical function(s). Functions noted in the block may occur out of the order noted in the figures. For example, two blocks shown in succession may, in fact, be executed substantially concurrently, or the blocks may sometimes be executed in the reverse order, depending upon the functionality involved.

Further, any sequence of steps that may be described does not necessarily indicate a condition that the steps be performed in that order. Some steps may be performed simultaneously.

More specifically, as will be appreciated by one skilled in the art, aspects of the present invention may be embodied as a system and/or method. Furthermore, aspects of the present invention may take the form of solar window system to provide color neutral transmission/reflection of incident light, generate electrical power from incident light, and be partially transparent in the visible region.

Introduction

The present invention provides a solar window system to enable light to be partially transparent in the visible region of the spectrum. The incident light on the solar window should be partially transparent in the 10% to 50% range in the visible region. The remaining light that is incident on the solar window should be converted into electrical power. The solar window can include a solar cell with power generating layers. The solar cell can enable the solar window to generate electrical power from the remaining incident light. In addition, the solar window can provide color neutral transmission and reflection of the incident light. In other words, the incident light will appear color neutral to an observer looking through the solar window.

The solar cells can include a transparent conductive oxide (TCO) contact layer, a hole transport (HTL) oxide layer made of Nickel Oxide (NiO), a perovskite absorber layer, and an electron transport (ETL) oxide layer made of Tin Oxide ($SnO_2$). All of the layers in the solar cell mentioned above can be made of optical thickness that will allow for color-neutral transmission of incident light. In addition, the perovskite absorber layer within the solar cell allows for the generation of electrical power from the incident light. In addition, the perovskite absorber layer being configured between the HTL oxide layer and the ETL oxide layer and the TCO contact layers protects the perovskite absorber layer from any outside humidity that is incident on the solar window. The TCO contact layers, the HTL oxide layer, and the ETL oxide layer provide a hermetic seal for the perovskite absorber layer, wherein the perovskite absorber layer is configured directly in between the TCO contact layers, the HTL oxide layer, and the ETL oxide layer, and is thereby protected from any outside humidity.

The solar cell may also be configured by several methods. In an embodiment, every layer of the solar cell, including the TCO contact layer, HTL oxide layer, perovskite absorber layer, and the ETL oxide layer, can be deposited on a first substrate. A second substrate can then provide a cap to the TCO contact layer, the HTL/ETL oxide layers, and the perovskite absorber layer. In another embodiment, all of the layers of the solar cell can be deposited on the second substrate, and the first substrate can provide a cap to one of the TCO contact layers. In yet another embodiment, half of the layers can be deposited on the first substrate, and half of the layers can be deposited on the second substrate. For instance, a TCO contact layer, the HTL oxide layer and half of the perovskite absorber layer can be deposited on the first substrate. On the second substrate, the other TCO contact layer, the ETL oxide layer and the other half of the perovskite absorber layer can be deposited. As such, the layers can be joined together, wherein both of the perovskite absorber layers can be fused together. In all of the embodiments, the TCO contact layers and the oxide layers provide a hermetic seal to the perovskite absorber layer. In addition, in all of the embodiments, the edges of the first and second substrate can be sealed by laser glass-to-glass welding and/or window sealing technologies based on polyisobutylene (PIB).

System Structure

FIG. 1, illustrates a chromaticity chart 100. A transmission spectrum of a solar window should correspond to the center of the white region of the chromaticity chart 100. The solar window can be configured with one or more solar cells. One of the major requirements for each solar cell is to be partially transparent in the visible region of the chromaticity chart 100. The solar cell should be partially transparent in the 10%-50% range. Combined with transparency in this region, the solar cell should absorb or reflect the infrared region of the spectrum, and convert the rest of the visible spectrum to electrical power. The light that would be blocked by a window tint in other windows should be converted to electrical power in the solar window. In addition, the solar window needs to be color neutral to observers of the solar window. The transmission and reflection should be color neutral. Observers looking at transmission through or reflectance from the solar window should observe a non-colored white spectrum if the window is illuminated with white light. As such, the transmission spectrum of the solar window should correspond to the center of the white region of the chromaticity chart 100 in FIG. 1. As a result, human color perception of objects viewed through the window will not be altered by the solar window.

In FIG. 1, the coordinates of the chromaticity chart can be calculated with the following:

$$X = \sum_{380}^{760} p\bar{x}t$$

$$Y = \sum_{380}^{760} p\bar{y}t$$

$$Z = \sum_{380}^{760} p\bar{z}t$$

$$x = \frac{X}{X+Y+Z}$$

-continued $$y = \frac{Y}{X+Y+Z}$$

$$z = \frac{Z}{X+Y+Z}$$

$$u' = \frac{4x}{12y-2x+3}$$

$$v' = \frac{9y}{12y-2x+3}$$

As seen above for FIG. 1, the variables for the equations include—p for the illuminant, x-bar is the red response curve of the human eye, y-bar is green response curve of the human eye, z-bar is the blue response curve of the human eye, and t is the transmission curve of the solar window. Accordingly, the solar window should absorb or reflect the infrared region of the spectrum, and convert the remaining portion of the visible spectrum into electrical power. In addition, to appearing neutral to an observer, to where the observer does not notice any distinct colors, the transmission spectrum of the solar window should correspond to the center of the white region of the chromaticity chart 100 in FIG. 1.

In FIG. 1, CIE coordinates for both transmission and reflectance are illustrated. For the 120 nm thickness, aSi (silicon-based) appears orange in transmission and neutral in reflectance. In transmission, the perovskite (MAP1) appears orange for a thickness of 480 nm (large diamond). However, the MAP1 transmission approaches the white region for the 120 nm thickness (small diamond). In addition, MAP1 appears neutral in reflection for both the 120 (small diamond) and 480 nm (large diamond) thicknesses. With the proper solar cell design, as will be shown in FIGS. 6-7(*a*)-(*c*), the MAP1 stack (open star) can be closer to the white point in transmission.

Figure 2:
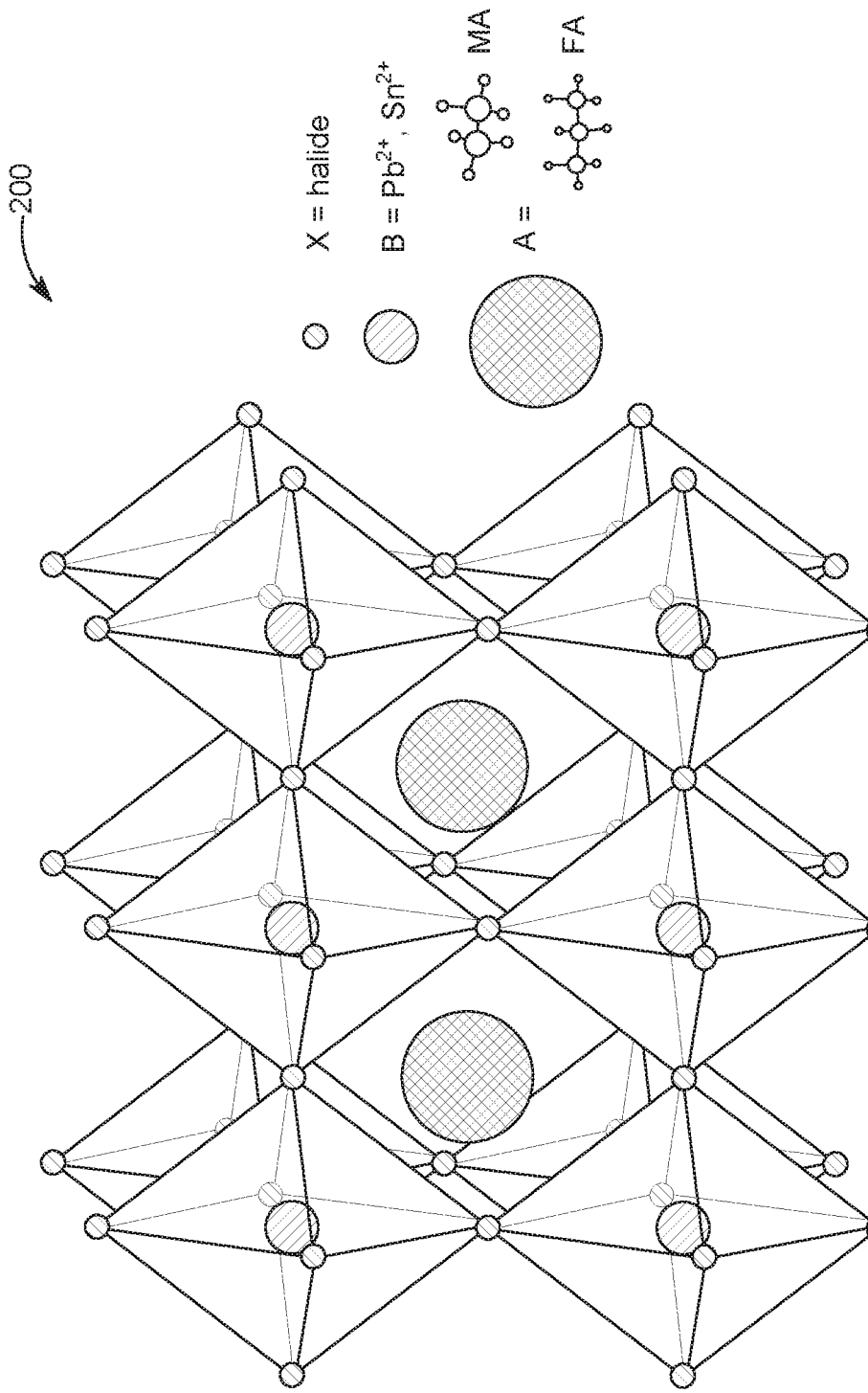
FIG. 2 illustrates a perovskite crystal structure in accordance with an embodiment of the presently disclosed embodiments.

Referring to FIG. 2, a perovskite crystal structure 200 is illustrated. Perovskite solar cells can be used in solar windows. A perovskite crystal shown in FIG. 2 includes methylammonium lead iodide ($CH_3NH_3PbI_3$)—ie MAP1. A single perovskite layer may appear orange for a transmission point for 480 nanometers (nm) as shown in FIG. 1. Nevertheless, the optical properties of perovskite-based solar windows allow for color-neutral transmission and reflection of incident light on the solar window. In addition, the optical properties of perovskite-based solar windows enable the solar windows to generate electrical power from incident light given the thin layers of the perovskite-based solar cells.

Still referring to FIG. 2, in contrast to the thin layers of perovskite-based solar cells, solar cells using silicon (Si), CdTe, and CIGS, as examples, cannot be made thin enough to provide color-neutral light from incident light, and generate electrical power from incident light. Further, perovskite-based solar cells are also made from more abundant materials as opposed to CdTe solar cells. Perovskite solar cells are low cost alternatives to silicon solar cells and other solar cells which are not as thin. In addition, perovskite solar cells and perovskite-based thin film photovoltaics have shown to be very promising with regard to high efficiency solar cells, wherein photovoltaics is the conversion of light into electricity using semiconductor materials that exhibit the photovoltaic effect. Further, the photovoltaic effect is the generation of voltage and electric current in a material upon exposure to light. Accordingly, perovskite solar cells provide promising and additional features that other solar cells mentioned above do not provide.

Figure 3A:
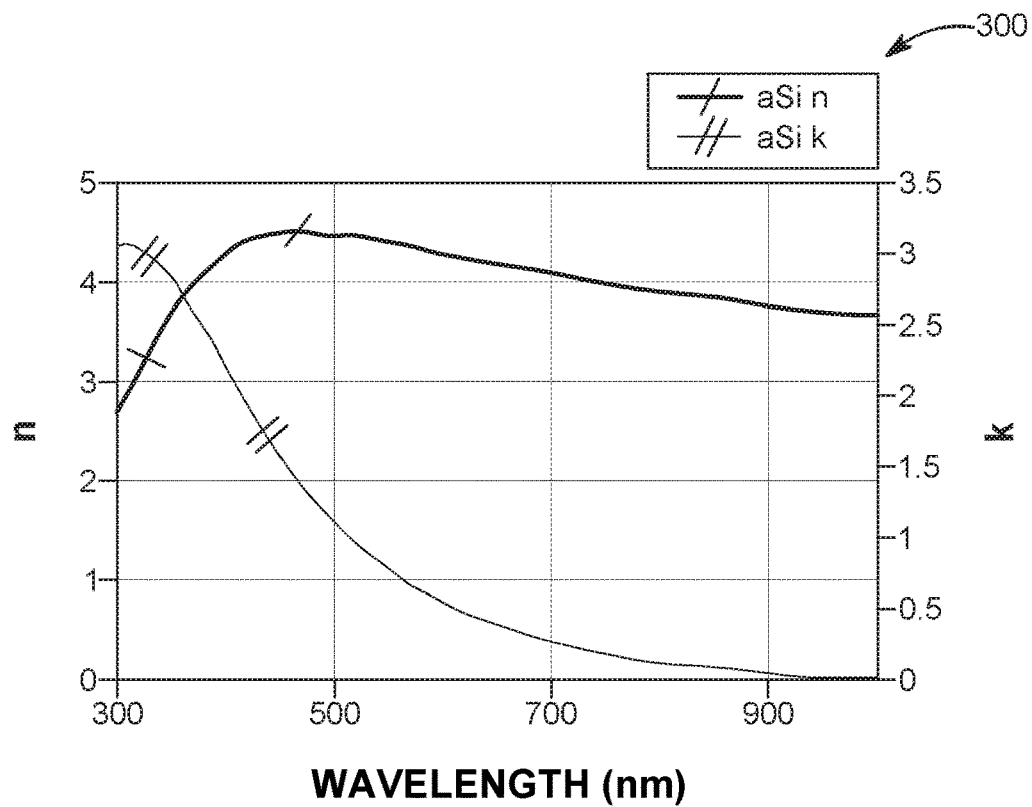
FIGS. 3(a)-(b) illustrates comparative graphs of silicon and perovskites in accordance with an embodiment of the presently disclosed embodiments.
Figure 3B:
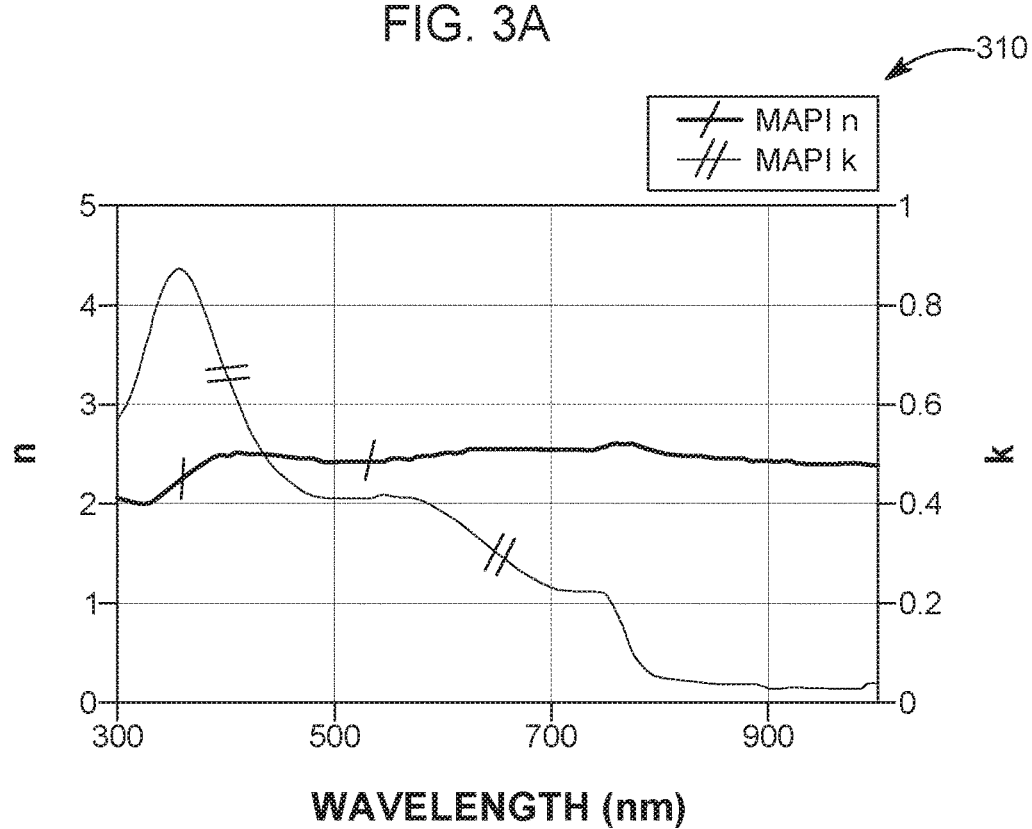

In FIGS. 3(a)-(b), comparative graphs 300, 310 of silicon (aSi) and perovskite (MAP1) are shown. Real and imaginary components n and k are illustrated. The component n relates to the speed of light, while the component k relates to the absorption of light within a material. In the graphs 300, 310 both aSI and MAP1 have a high k at shorter wavelengths. However, at visible wavelengths, MAP1 exhibits a flatter k and also a flatter n in all wavelengths. The shapes of the dispersion curves where the MAP1 exhibits the flatter k at visible wavelengths, and a flatter n at all wavelengths are due to the band structure of the MAP1 materials. Accordingly, the MAP1 having a flatter n and k at visible wavelengths and a flatter n at all wavelengths are incorporated in the solar cell design that will be described below in later figures.

Figure 4A:
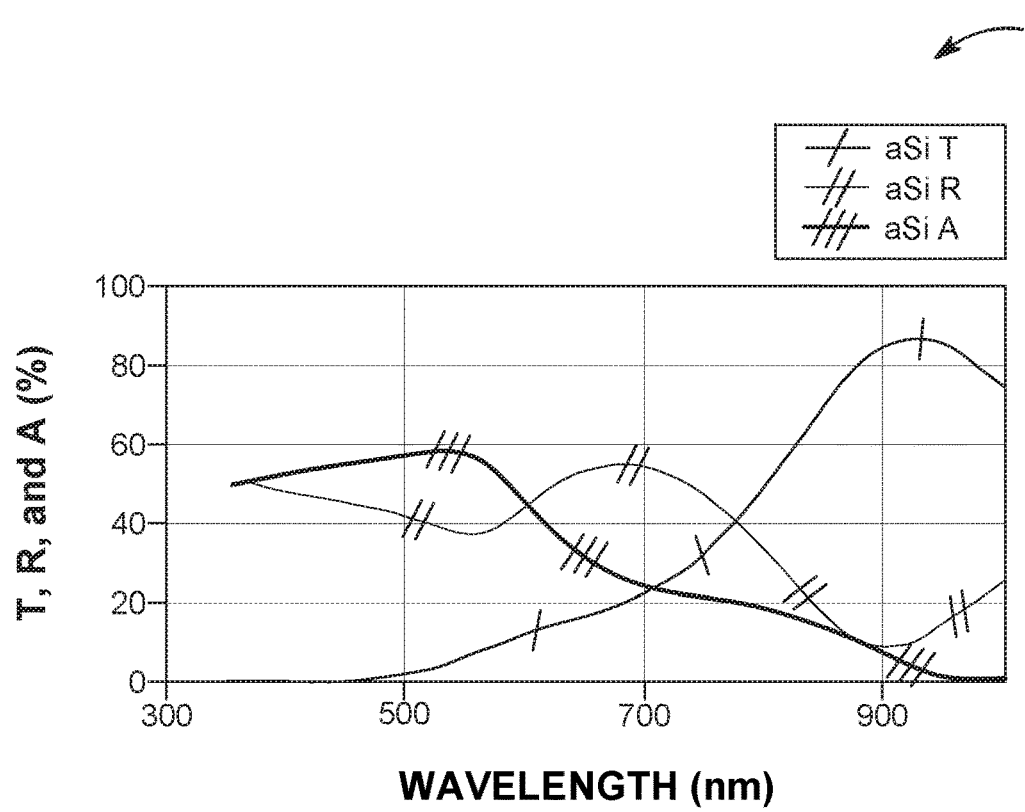
FIGS. 4(a)-(b) illustrates a transmission, reflectance, and absorption of silicon and perovskites single layers in accordance with an embodiment of the presently disclosed embodiments.
Figure 4B:
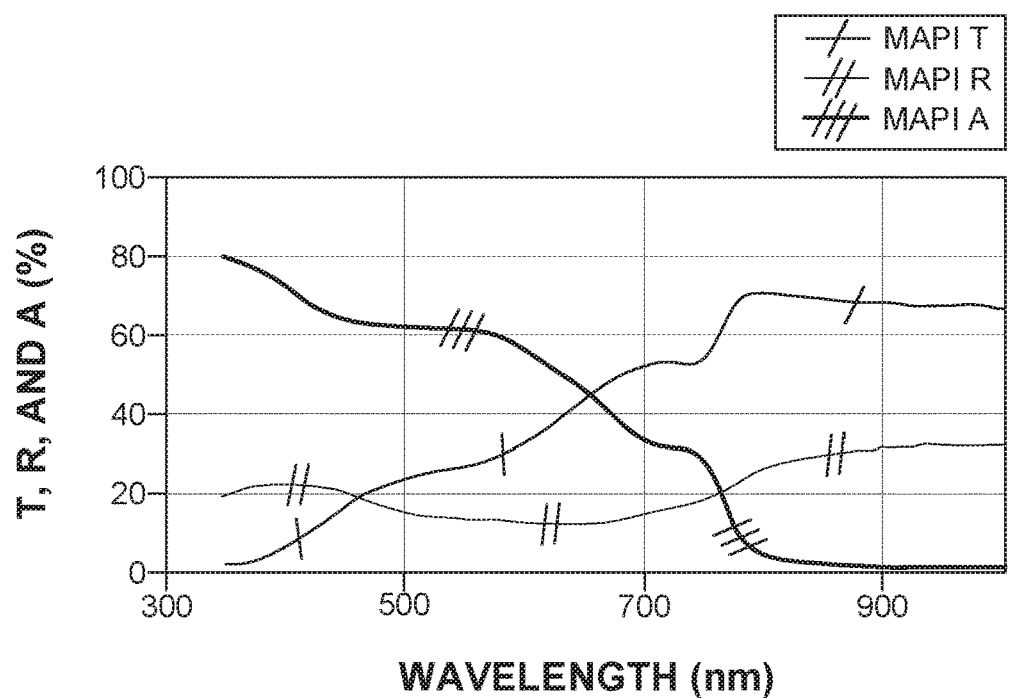

Referring to FIGS. 4(a)-(b), the n and k values shown in FIGS. 3(a)-(b) are used to calculate the transmission, reflectance, and absorption of thin layers of aSi and MAP1, 400, 410 as illustrated in FIGS. 4(a)-(b). As shown in FIGS. 4(a)-(b), the MAP1 has a flatter transmission curve in the visible than Si. The MAP1's transmission is tilted in the 700-900 nm wavelength range. The transmission curves invariably change with the thickness. In FIGS. 4(a)-(b), each curve was calculated for a thickness of 120 nm.

In FIG. 4(b), in the red region, MAP1's transmission can be too high for neutrality. Although its transmission may be too high for a single layer of MAP1, it is clearly not obvious that a full solar cell stack that includes the MAP1 absorbing layer can actually be neutral, as will be shown in later figures described below. As shown in the graphs 400, 410, MAP1 exhibits a low flat reflectance while aSi shows a higher reflectance with a pronounced fringe in the visible range. Further, the graphs 400, 410 show that MAP1 provides a higher degree of absorption due to the effects of the n and k (n and k first described in FIGS. 3(a)-(b)). In addition, as described above in FIG. 1, the aSi appears orange in transmission at a 120 nm thickness, and neutral in reflectance at the 120 nm thickness. In contrast, MAP approaches the white region in transmission at the 120 nm thickness (small diamond), and is also neutral in reflectance at 120 (small diamond) and 480 nm thicknesses (large diamond).

Figure 5:
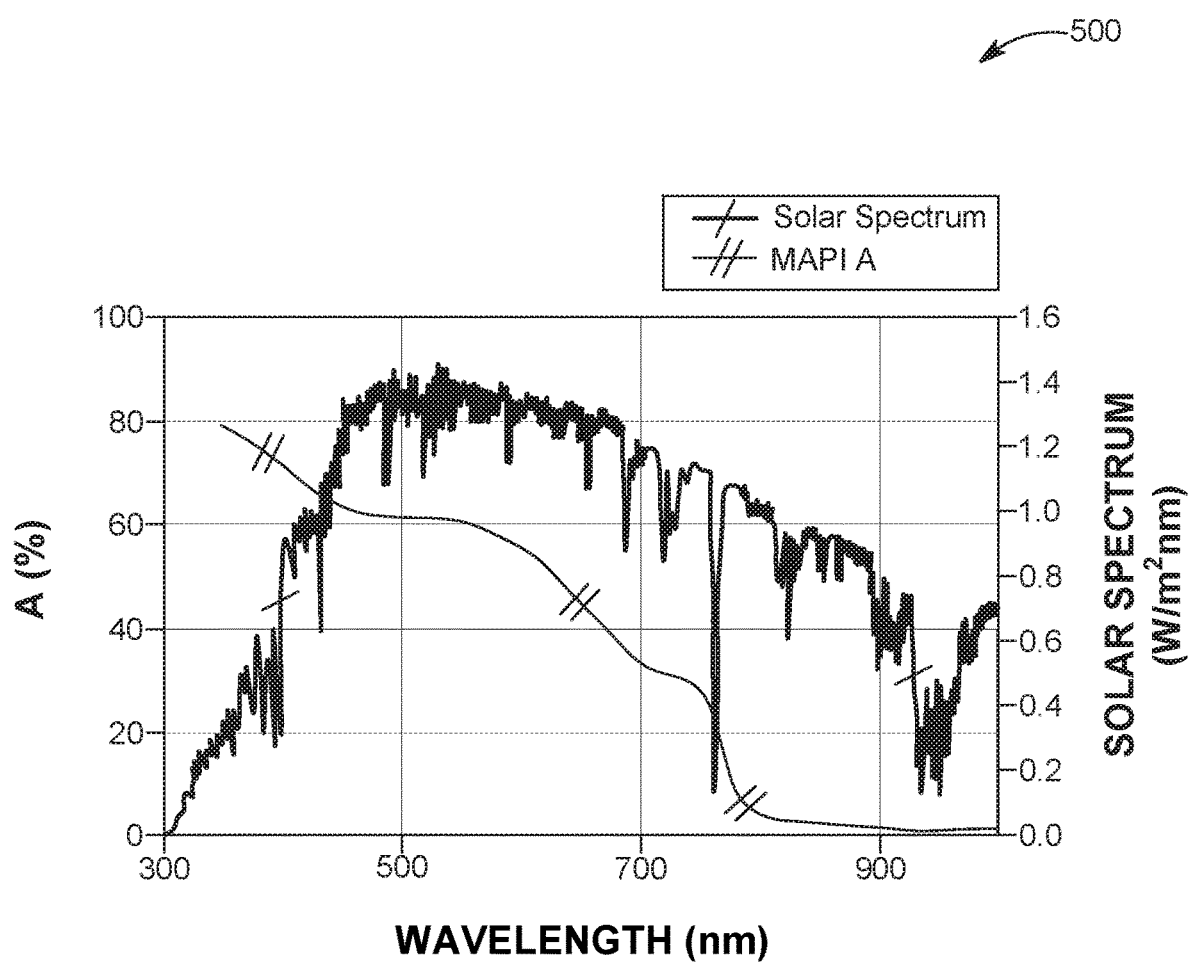
FIG. 5 illustrates a MAP1 single layer absorption graph on a solar spectrum in accordance with an embodiment of the presently disclosed embodiments.

Referring to FIG. 5, an illustration 500 of an MAP1 absorption overlaid on a solar spectrum is illustrated. An overlay of MAP1's absorption with the air mass 1.5 solar spectrum is shown. Absorption of the solar radiation reaches to about 750 nm. In contrast, perovskite alloys of MAP1 and methyl ammonia tin iodide (MATl) can absorb to near 1060 nm.

In order to take advantage of the perovskites, the perovskite's should be implemented into a cell design that can enable the solar cell to be able to use its properties to provide color neutral transmission and reflection of incident light. In addition, the perovskite solar cells should be implemented in a cell design that can also enable the solar cell including the perovskite to generate electrical power from incident light as well.

Figure 6:
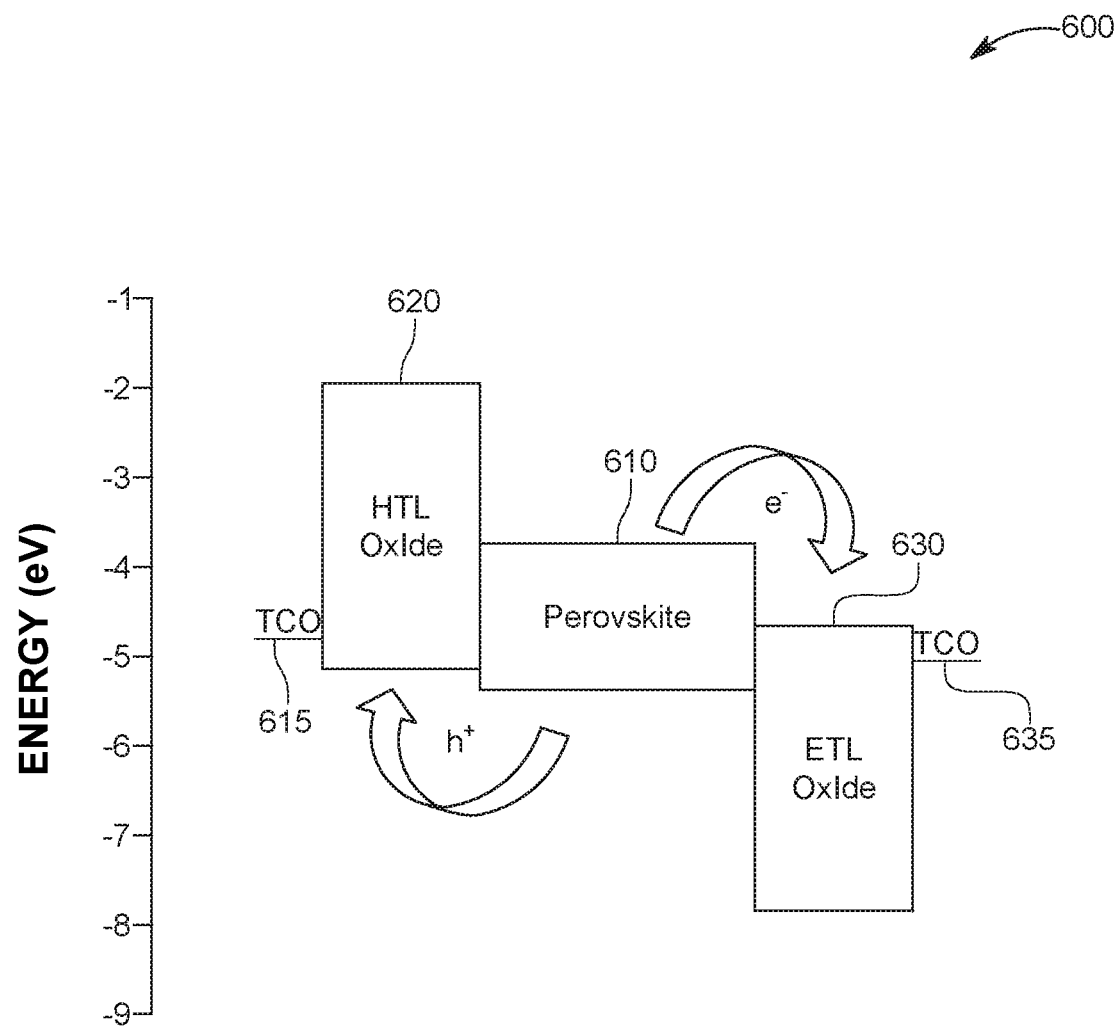
FIG. 6 illustrates a solar cell design in accordance with an embodiment of the presently disclosed embodiments.

Accordingly, as in FIG. 6, a cell design 600 involving a perovskite absorber layer 610 is illustrated. The perovskite absorber layer 610 is configured in between a TCO contact layer 615, hole transport layer (HTL) 620, an electron transport layer (ETL) 630 and another TCO contact layer 635. Energy levels along the vertical axis and the layer thickness along the horizontal axis are depicted. The cell design 600 includes glass/TCO/HTL/perovskite/ETL/TCO/ glass, wherein TCO indicates a transparent conductive oxide.

In FIG. 6, solar photons are absorbed in the perovskite layer 610, which lead to free electrons in the conduction band and free holes in the valence band. The electrons and holes are physically separated by electric fields within the structure. The work functions of each layer 610, 615, 620, 630, and 635 establish the electric fields within the structure. The ETL is an n-type material that transports electrons and blocks holes. The HTL is a p-type material that transports holes and blocks electrons. TCOs mentioned above collect the carriers. The preferred layout of the cell design 600 can use a perovskite layer of MAP1 or MATl that is surrounded by nickel oxide (NiO) HTL, a tin oxide ($SnO_2$) ETL, and two indium tin oxide conductive oxides. Due to the presence of oxygen vacancies, the NiO HTL is p-type, while the $SnO_2$ ETL is n-type. Embedding the perovskite layer 610 in an all-oxide and TCO contact layer stack enables transparency and seals the absorber from the environment. The HTL oxide 620, ETL oxide 630 and the TCO contact layers 615, 635 provide a hermetic seal for the perovskite layer 610, in which the hermetic seal protects the perovskite layer 610 from external humidity incident on the solar window.

Still referring to FIG. 6, many options for each of the layers 610, 615, 620, 630 and 635 can be used. All of the layers are constrained by providing energy levels for carrier separation and by neutrality analysis. The perovskite absorber layer 610 can be MAP1, MATl, formamidinium lead iodide (FAPl), formamidinium tin iodide (FATl), Cs based perovskites and alloys of the layers described above. The iodides can also be replaced by chlorides and bromides of these components. Thin interfacial layers can also be configured between the perovskite, the oxide layers, and the TCO contact layers to minimize carrier loss at the interfaces. The Nickel Oxide (NiO) can also be replaced with other materials with appropriate work functions such as copper iodide, copper oxide, PEDOT:PSS, spiro-OMeTAD, and TIPS-pentacene. The Tin Oxide ($SnO_2$) can also be replaced with other oxides such as $TiO_2$ and ZnO or other materials such as PCBM. The tin oxide can be treated with chemicals such as EDTA to prevent carrier trapping. Further, the Indium Tin Oxide (ITO) contacts can be replaced with other TCOs with appropriate work functions and conductivity such as fluorine doped tin oxide (FTO), and aluminum doped zinc oxide (AZO). The TCO's also serve the purpose of low-E coatings as they reflect most of the infrared back into the atmosphere as will be illustrated in FIG. 8.

In FIG. 6, the solar cell design 600 targets a photovoltaic efficiency of 8-10%, and a color neutral transmission of about 20 to 30%. Designing the solar cell 600 as an interference filter improves the color neutrality. Each layer in the stack of the solar cell 600 are included in a thin film model that can predict spectral curves for transmission and reflectance. Unlike most solar cells, the solar cell 600 is not designed to maximize absorption. The thin film model can include the indices for MAP1, published indices for NiO and $SnO_2$, and the indices for a highly conductive (~10 ohm/ square) ITO. The thin film model employed the 900 nm ITO, 25 nm $SnO_2$, 120 nm MAP1, 75 nm NiO, and 550 nm ITO. Other thicknesses may also be used for the thin film model.

Figure 7A:
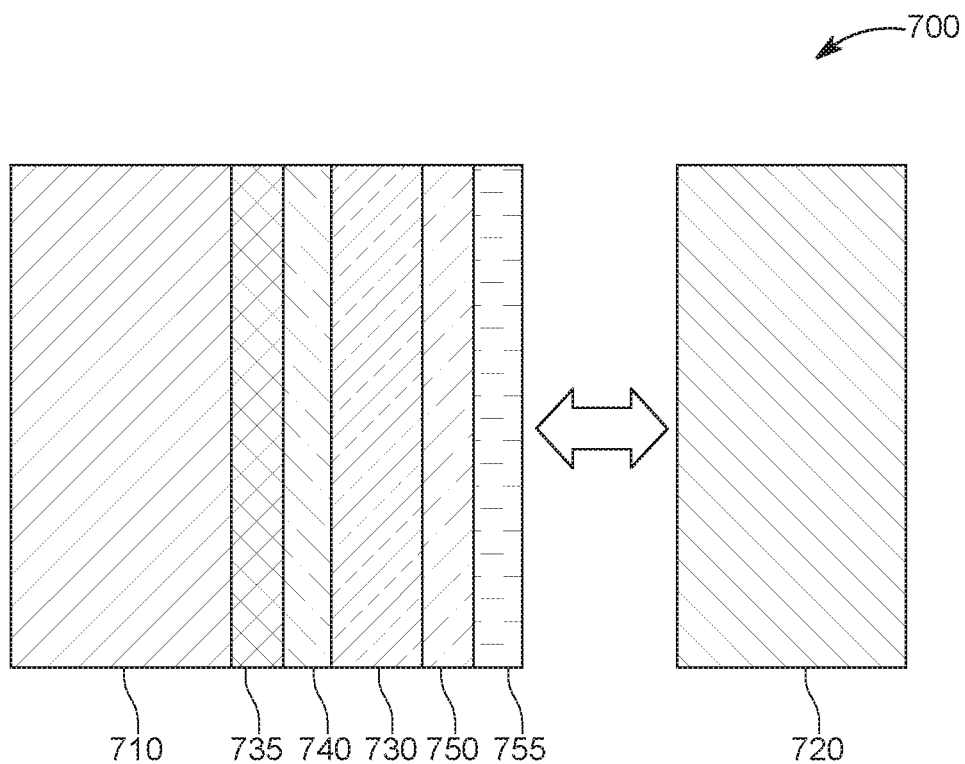
FIG. 7(a)-(c) illustrating deposition methods for elements of solar cells in accordance with embodiments of the presently disclosed embodiments.
Figure 7B:
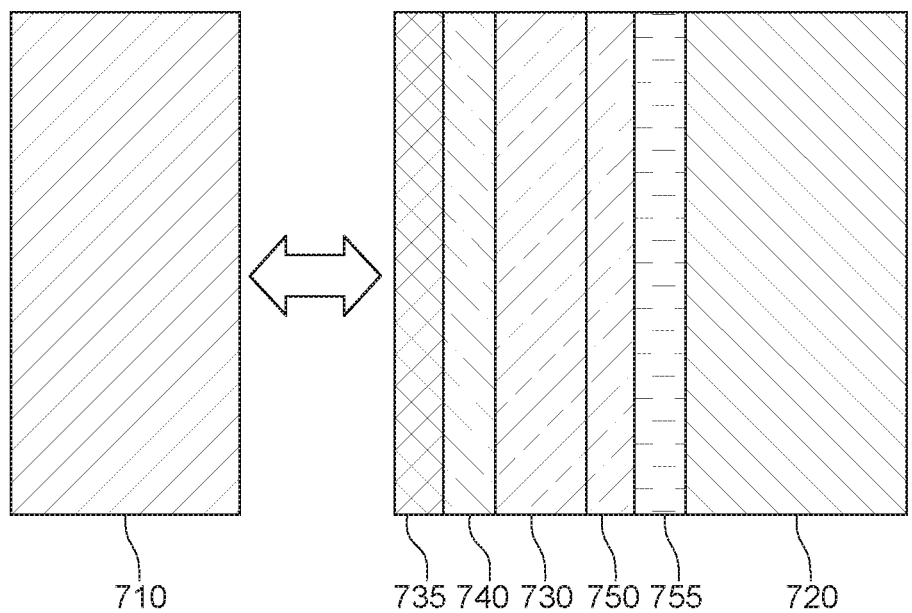
Figure 7C:
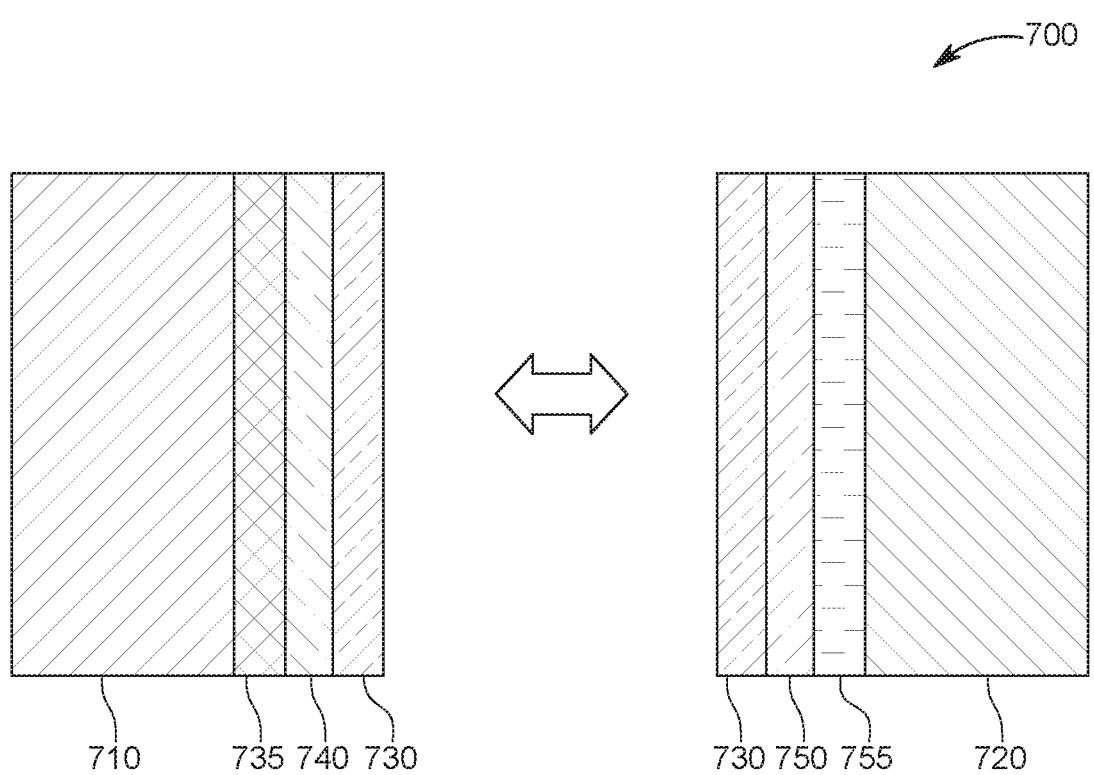

In FIGS. 7(a)-7(c), three different deposition sequences are illustrated for the cell design described in FIG. 6. Moreover, ink jet printing, slot dye coating, blade methods, co-evaporation, electro-spray, spin coatings, hot casting, and chemical vapor deposition are the leading deposition techniques for perovskites.

In FIG. 7a, a system 700 with a first substrate 710 and a second substrate 720 is illustrated. Within (or on) the first substrate 710, all of the layers can be deposited. The layers include the perovskite absorber 730, a TCO contact layer 735, the HTL oxide 740, the ETL oxide 750, and another TCO contact layer 755. As in FIG. 6, the perovskite absorber 730 is positioned between the oxide layers 740, 750 and also the TCO contact layers 735, 755 respectively. Once the TCO contact layer 735, HTL oxide layer 740, perovskite absorber layer 730, the ETL oxide layer 750, and the TCO contact layer 755 are deposited on the first substrate, the second substrate 720 can be used to cap off the first substrate 710. The second substrate 720 will be configured directly opposite to the first substrate 710. The TCO contact layer 735, The HTL oxide layer 740, perovskite absorber layer 730, ETL oxide layer 750, and TCO contact layer 755 are positioned directly in between the first substrate 710 and the second substrate 720.

In FIG. 7(b), the first substrate 710 can be positioned at a first position. Further, the TCO contact layer 735, HTL oxide layer 740, perovskite absorber layer 730, ETL oxide layer 750, and TCO contact layer 755 can be deposited on the second substrate 720. Once the TCO contact layer 735, HTL oxide layer 740, perovskite absorber layer 730, ETL oxide layer 750 and TCO contact layer 755 are positioned on the second substrate 720, the first substrate 710 can be used to cap off the layers positioned on the second substrate 720. The first substrate 710 is positioned directly opposite to the second substrate 720. Moreover, the first substrate 710 has the TCO contact layer 735, HTL oxide layer 740, perovskite absorber layer 730, ETL oxide layer 750 and TCO contact layer 755 directly between itself and the second substrate 720.

Referring to FIG. 7(c), yet another embodiment is illustrated. Unlike FIGS. 7(a), and 7(b), in FIG. 7(c), half of the layers can be deposited on the first substrate 710, and half of the layers can be deposited on the second substrate 720. On the first substrate 710, the TCO contact layer 735, the HTL oxide layer 740, and half of the perovskite absorber layer 730 can be deposited on the first substrate 710. On the second substrate 720, the other half of the perovskite layer 730, the ETL oxide layer 750, and the TCO contact layer 755 can be deposited. In this embodiment, either substrate 710, 720 can be considered capping layers. In addition, both half layers of the perovskite absorber layer 730 are fused together. Heat and/or pressure can be used to fuse both half layers of the perovskite layer 730 together into one layer. In this embodiment, energetic deposition of the TCO contact layer 735, HTL oxide layer 740, the ETL oxide layer 750 and the TCO contact layer 755 onto the more fragile perovskite absorber layer 730 is avoided.

Figure 8:
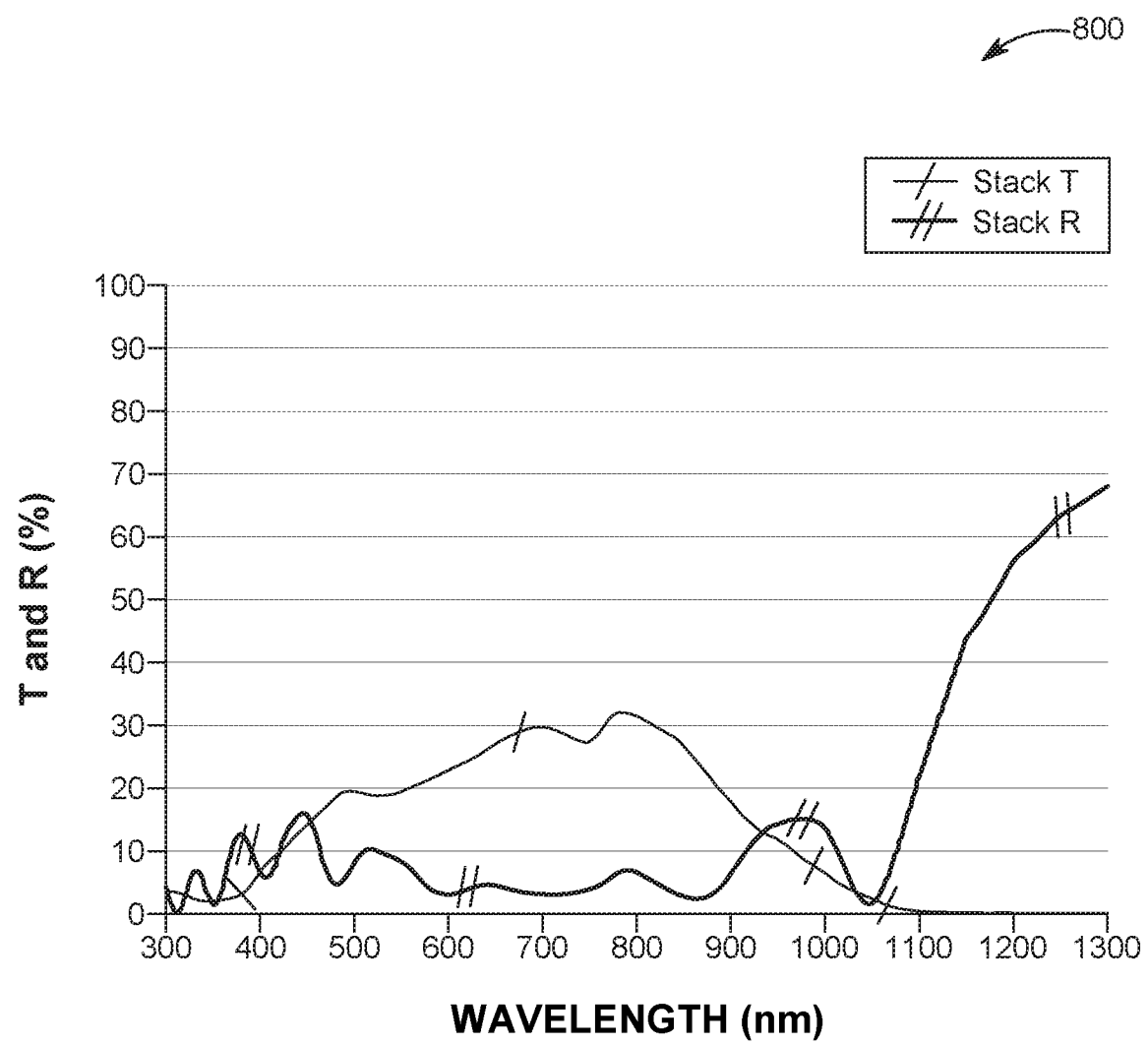
FIG. 8 illustrates a transmission and reflectance of a solar window in accordance of the presently disclosed embodiments.

In FIG. 8, a transmission and reflectance 800 for the solar cell that is described in FIGS. 6-7(c) is illustrated. Unlike FIGS. 4(a)-(b), which illustrates the transmission and reflectance of a single layer of MAP1, FIG. 8 illustrates that the solar cell/window has a flatter transmission and reflectance 800 than a single layer of MAP1. The solar cell with a stack of oxide layers providing a hermetic seal with perovskite layers have a flatter transmission and reflectance than a single layer of MAP1. Moreover, this illustration is consistent with the open star in FIG. 1 moving further toward the white point in the chromaticity diagram.

Figure 9:
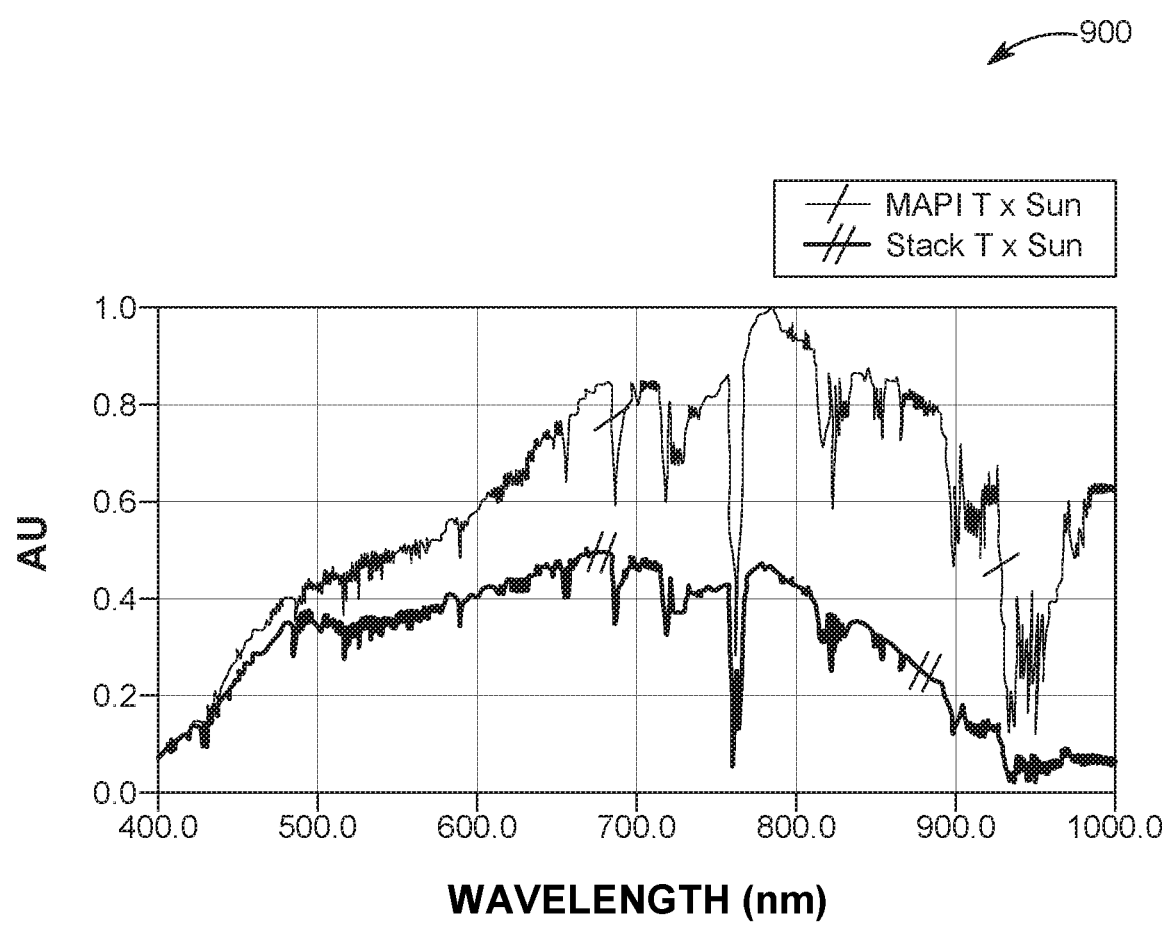
FIG. 9 illustrates a comparison graph of a single perovskite layer and a solar cell stack in accordance with an embodiment of the presently disclosed embodiments.

Referring to FIG. 9, a product of the solar spectrum with the transmission of both a single layer of MAP1 and the solar window is illustrated. A comparison 900 of the transmission of the single layer of MAP1 versus the solar window is shown. The solar window, which involves the stack of perovskite layers in between four oxide layers, clearly has a flatter transmission in the visible portion of the solar spectrum, where humans see light, as opposed to the single layer of MAP1.

Figure 10A:
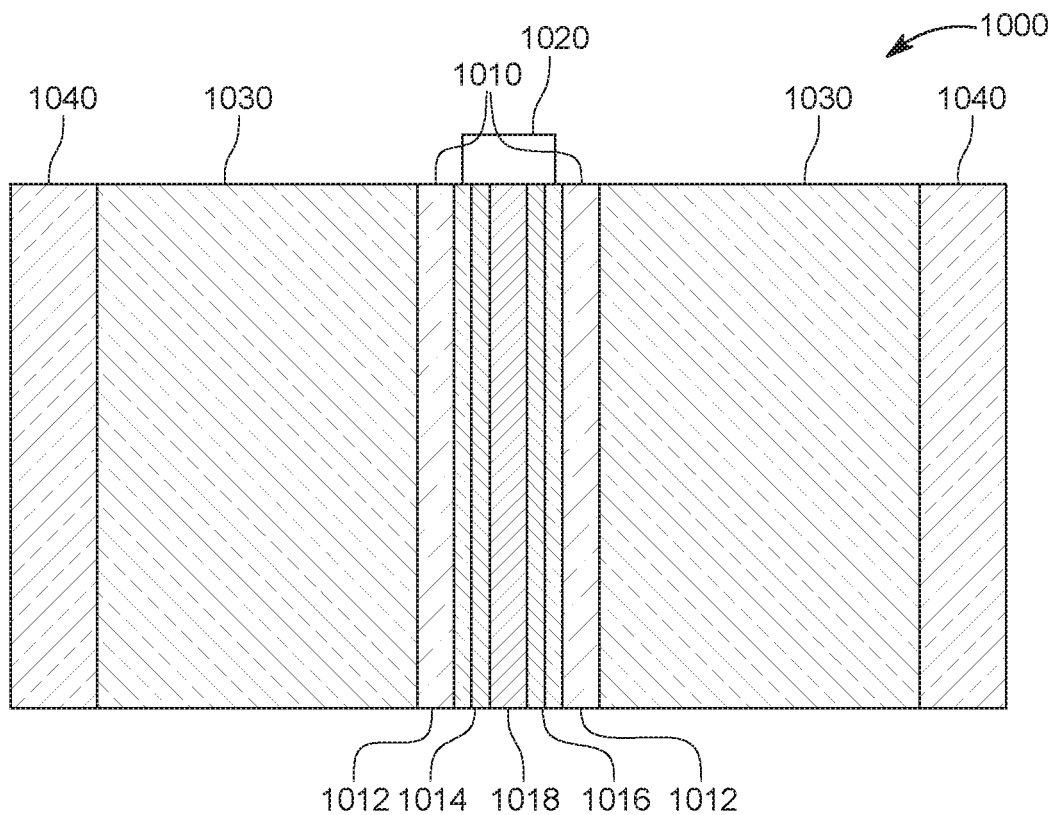
FIG. 10(a)-(b) illustrates cross section and a planar view of a solar window respectively, in accordance with embodiments of the presently disclosed embodiments.

In FIG. 10(a), a solar window 1000 is illustrated. The solar window 1000 has all the features of the solar cell described above in FIG. 6 and other figures mentioned above. The solar window 1000 includes a solar cell 1010. The solar cell 1010 includes substrates/cover glasses 1012. Next to those substrates 1012 are transparent conductive oxide (TCO) contact layers 1020, an HTL oxide layer 1014, a perovskite absorber layer 1018, and an ETL oxide layer 1016. In between the HTL oxide layer 1014 and the ETL oxide layer 1016, a perovskite absorber layer 1018 is configured. The TCO contact layers 1020, the HTL oxide layer 1014 and the ETL oxide layer 1016 provide a hermetic seal for the perovskite absorber layer 1018. The TCO contact layers 1020, HTL oxide layer 1014 and the ETL oxide layer 1016 protect the perovskite absorber layer 1018 from any external humidity incident onto the solar window 1000.

Still referring to FIG. 10(a), the solar cell 1010 is illustrated. The layers that make up the solar cell 1010 include the substrates 1012, the HTL oxide layer 1014, the ETL oxide layer 1016, the perovskite absorber layer 1018, and the TCO contact layers 1020. These layers collectively function as the solar cell 1010. One key feature of the solar cell 1010 is the hermetic seal that is provided to the perovskite absorber 1018. Within the solar cell 1010, the TCO contact layers 1020, HTL oxide layer 1014 and the ETL oxide layer 1016 provide a hermetic seal for the perovskite absorber 1018. Perovskite cells on their own can be vulnerable to humidity. Nevertheless, the hermetic seal around the perovskite absorber 1018 can ensure that the perovskite absorber 1018 is protected from any humidity that can be incident on the solar cell 1010.

In FIG. 10(a), another key feature of the solar cell 1010 is color neutrality in transmission and color neutrality in reflection of incident light. As described in FIG. 1, the optical properties of perovskites allow for color-neutral transmission and reflection of incident light. When the perovskite absorber layer 1018 is placed within a stack as in the solar cell 1010 described above, the perovskite absorber layer 1018 can collectively, along with the other elements of the solar cell 1010, enable the solar cell 1010 to provide color-neutral transmission and reflection to light incident to the solar cell 1010 and solar window 1000. As such, an observer of the solar window 1000 will see a color-neutral transmission and reflection of the light incident on the solar window 1000. The color-neutral transmission and reflection of the incident light is due to each layer of the solar cell 1010. The TCO contact layers 1020, the HTL oxide layer 1014, the perovskite absorber layer 1018, and the ETL oxide layer 1016 collectively function to provide the color-neutral transmission and reflection of the incident light on the solar window 1010.

Still referring to FIG. 10(a), another key feature of the solar cell 1010 within the solar window 1000 is the ability to generate electrical power from incident light. A necessary feature of the solar window 1000 would be not only to pass a desired amount of incident light, but to also generate electrical power with the remaining incident light that would ordinarily be blocked by a tint in other windows. The solar cell 1010, including the perovskite absorber 1018 embedded between the oxide layers 1014, 1016 and the TCO contact layers 1020 can generate electrical power from the incident light.

In FIG. 10(a), gaps 1030 can be configured around the solar cell 1010. The gaps 1030 can be filled with argon. The argon within each gap 1030 can further protect the solar cell 1010. Further, at both ends of the solar window 1000 are window panes 1040. The window panes 1040 can be coated to prevent ultraviolet (UV) damage onto the solar cell 1010. In addition, the substrates 1012 can both be coated to prevent the UV damage on the solar cell 1010, and on the perovskite absorber layer 1018. The coating can also adjust color if needed as well.

Figure 10B:
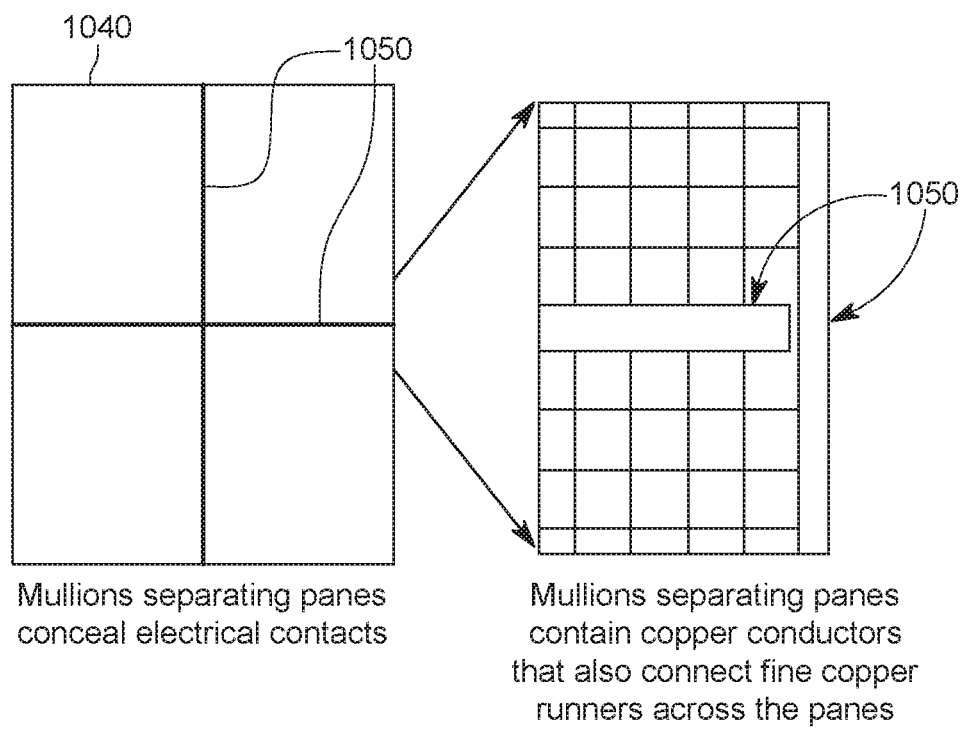

Referring to FIG. 10(*b*), another aspect of the solar window 1000 is illustrated. More specifically, mullions 1050, which are vertical/horizontal elements that form a division between units of the window panes 1040, are illustrated. The mullions 1050 separate panes and also conceal electrical contacts. Moreover, the mullions 1050 can also connect to fine copper runners across the substrates 1012 in the solar window 1000. The fine copper runners are not visible to the human eye. In addition, copper in the mullions 1050 critically connect to the TCO contact layers 1020 for the anode and cathode of the solar cell 1010. Further one of the TCO contact layers 1020 can connect to the vertical mullion 1050, while the other TCO contact layer 1020 can connect to the horizontal mullion 1050.

Figure 11:
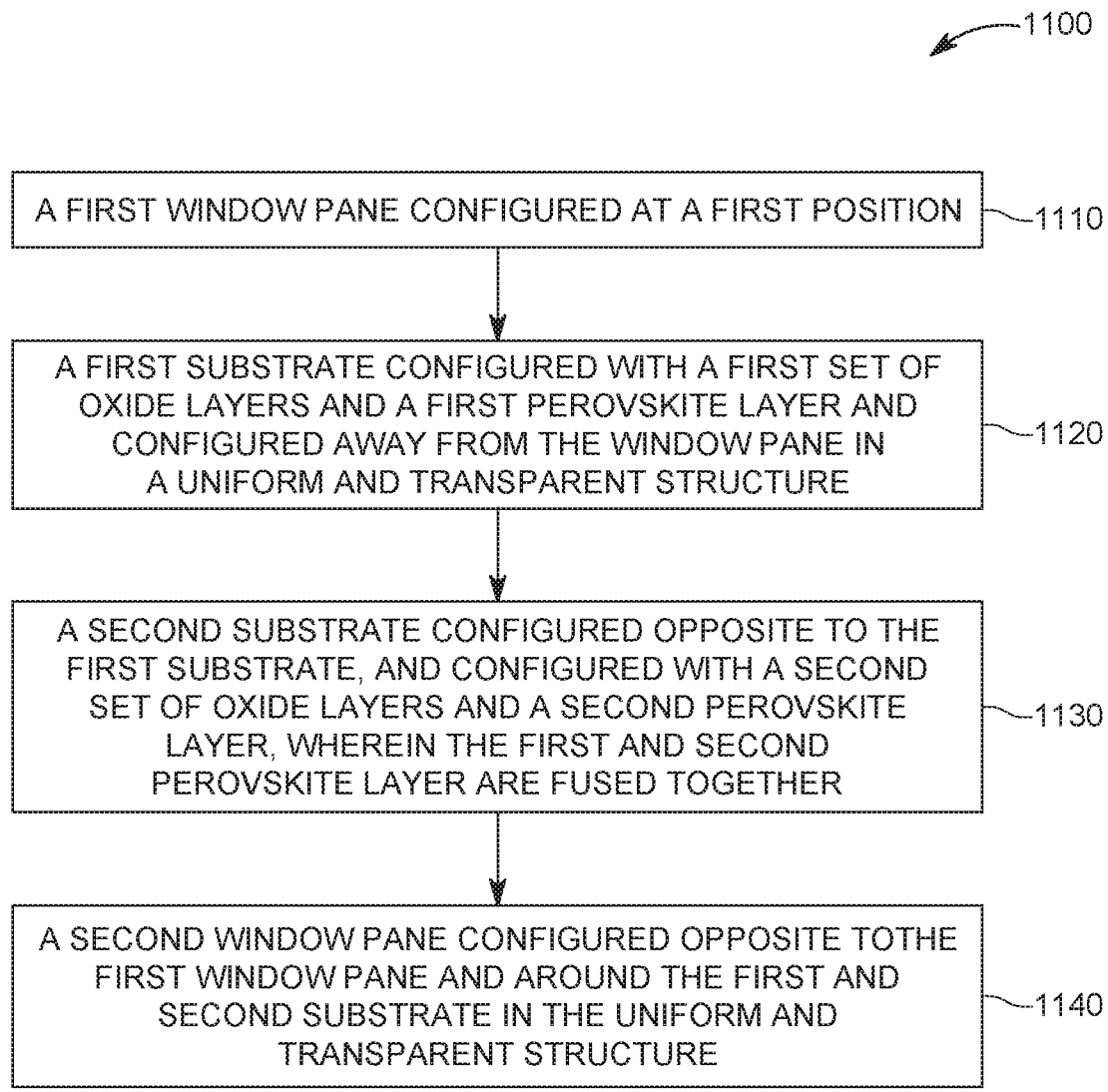
FIG. 11 illustrates a flowchart in accordance with an embodiment of the presently disclosed embodiments.

In FIG. 11, a method 1100 for constructing the solar window described in FIG. 10(*a*)-(*b*) is described below. At step 1110, a first window pane is configured at a first position in a uniform and transparent structure. The solar window can have two window panes that are configured opposite to one another. The first window pane can thereby be placed at one side of the solar window. At step 1120, a first substrate can be configured within the uniform and transparent structure. On the first substrate, metal runners and a TCO contact layer can be deposited, followed by an HTL oxide layer and a first perovskite absorber layer. Moreover, the HTL oxide layer can be configured as shown in FIG. 6. The first perovskite layer can be configured in contact with the HTL oxide layer.

In FIG. 11, after the elements of the solar cell have been deposited on the first substrate, at step 1130, a second substrate can be configured, directly opposite to the first substrate. The second substrate can include a second perovskite layer, an ETL oxide layer, a TCO contact layer, and metal runners. The layers on the first and second substrates can be joined together, as such the second perovskite layer can be fused together with the first perovskite layer. The first and second perovskite layer can thereby be fused together into a single layer in the uniform and transparent structure. Heat and/or pressure can be used to fuse together the first and second perovskite layer. In addition edges of the first and second substrate can be sealed by laser glass-to-glass welding and/or window sealing technologies based on Polyisobutylene (PIB) or similar commercial adhesives.

Referring to FIG. 11, the TCO contact layers and the HTL and ETL oxide layers form a hermetic seal on the fused first and second perovskite layer. The TCO contact layers and the HTL and ETL oxide layers can protect the first and second perovskite layers from outside humidity that can be incident on the solar window. The TCO contact layers and the HTL and ETL oxide layers combined with the first and second perovskite layers, form a solar cell. Collectively, the TCO contact layers and the HTL and ETL oxide layers with the fused first and second perovskite layers can provide color neutrality for both transmission and reflection of light incident on the uniform and transparent structure. The incident light will appear neutral to an observer viewing the uniform structure. In addition, the TCO contact layers and the HTL and ETL oxide layers, combined with the first and second perovskite layers, can also generate electrical power from light incident on the uniform and transparent structure.

In FIG. 11, at step 1140, a second window pane is configured at a second position in the uniform and transparent structure. The second window pane can be figured directly opposite to the first window pane in the uniform and transparent structure. The solar cell of the TCO contact layers, HTL and ETL oxide layers, and the fused first and second perovskite layer are configured in between the first window pane and the second window pane. Both the first and second substrate and also the first window pane and the second window pane can be coated to ensure that the perovskite layers in the solar cell are protected from UV damage or any form of color alteration.

Those skilled in the art will appreciate that the example embodiments are non-exhaustive and that embodiments other than that described here may be included without departing from the scope and spirit of the presently disclosed embodiments.

Advantages

Disclosed embodiments relate to methods and systems for configuring a solar cell with a perovskite absorber layer in a uniform and transparent structure with advantages that are not available in other solar cells. Several advantages and benefits occur for the solar window which incorporates the solar cell with perovskite absorber layers. An advantage is that the TCO contact layers and the HTL and ETL oxide layers can provide a hermetic seal to the perovskite absorber layer. As described above, single perovskite layers can be vulnerable to humidity. The solar cell of the present invention provides TCO layers, an HTL oxide layer and an ETL oxide layer to provide a hermetic seal to the perovskite layer. From this hermetic seal, the perovskite absorber layer is protected from any outside humidity that can be incident on the solar cell. Other ways to improve the seal can include where edges of the first and second substrate can be sealed by laser glass-to-glass welding. Other conventional window sealing technologies can be based on polyisobutylene (PIB). In addition, the space between the window panes and the solar cell can be filled with argon to help provide further protection for the perovskite absorber layer.

Another advantage is that the solar cell is able to provide a color neutral transmission and reflection of incident light. The solar window is treated as an interference filter. The transmission and reflection of the incident light can also appear color neutral and appealing to an observer. Reflections among the perovskite absorber layer and the surrounding HTL and ETL oxide layers and TCO contact layers can enable the solar cell to act as an interference filter, and provide color neutral transmission and reflection of incident light. The incident light will appear neutral to an observer of the solar window.

In addition, another advantage of the solar window is that the solar cell can generate electrical power from incident light. A desired amount of light can pass thru, while light that may be blocked by other windows with a tint, would in contrast, be generated into electrical power by the solar cell with the perovskite absorber layer, the HTL and ETL oxide layers, and the TCO contact layers. The power generating layers are semitransparent photovoltaic solar cells that include the perovskite absorber layer.

Accordingly, the present invention seamlessly and efficiently operates solar cell within a solar window, and provides several advantages not currently employed by other solar windows.

Conclusion

All references, including granted patents and patent application publications, referred herein are incorporated herein by reference in their entirety.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

Various aspects of the invention have been described above by way of illustration, and the specific embodiments disclosed are not intended to limit the invention to the particular forms disclosed. The particular implementation of the system provided thereof may vary depending upon the particular context or application. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

The corresponding structures, materials, acts, and equivalents of all means or step plus function elements in the claims below are intended to include any structure, material, or act for performing the function in combination with other claimed elements as specifically claimed.

What is claimed is:

1. A system comprising:
a first window pane configured at a first position in a semitransparent and uniform structure;
a first substrate configured with a first transparent conductive oxide (TCO) contact layer, a hole transport (HTL) layer, and a first perovskite layer, a second perovskite layer, an electron transport (ETL) layer, and a second TCO contact layer, wherein a second substrate covers the first TCO contact layer, the HTL layer, the first perovskite layer, the second perovskite layer, the ETL layer, and the second TCO contact layer, wherein the HTL layer includes oxides, or iodides or organic materials, wherein the ETL layer includes oxides or organic materials, wherein an order of HTL and ETL layer depositions can be reversed, wherein the first and second substrate are positioned at a set distance away from the first window pane in the semitransparent and uniform structure,
wherein the first substrate, first TCO layer, HTL layer, first perovskite layer, second perovskite layer, ETL layer, second TCO layer, and second substrate collectively primarily absorb incident light from a solar spectrum, wherein the incident light primarily absorbed from the solar spectrum is converted to electrical power, wherein a transmission spectrum of the incident light will correspond to the visible spectrum and provide color neutral transmission and reflection of the incident light, and wherein the first TCO contact layer, the HTL layer, the first perovskite layer, the second perovskite layer, the ETL layer, and the second TCO contact layer collectively act as an interference filter to primarily absorb incident light from the solar spectrum in a color neutral manner; and
a second window pane configured at a second position, wherein the second window pane is configured directly opposite to the first window pane, and around the first and second substrate in the semitransparent and uniform structure.

2. The system of claim 1, wherein the first perovskite layer and the second perovskite layer are fused together in the semitransparent and uniform structure.

3. The system of claim 1, wherein the first TCO contact layer, the HTL layer, the ETL layer, and the second TCO contact layer provide a hermetic seal to the first perovskite layer and the second perovskite layer.

4. The system of claim 1, wherein the first and second TCO contact layers, the HTL and ETL layers, and the first and second perovskite layers provide color neutrality with transmission and reflection to incident light that passes between the first and second window pane and generate electrical power from the incident light absorbed from the solar spectrum.

5. The system of claim 1, wherein the first and second substrate are sealed by laser glass-to-glass welding and/or polyisobutylene (PIB) sealing.

6. The system of claim 1, wherein the HTL layer is made of Nickel Oxide (NiO), the ETL layer is made of Tin Oxide ($SnO_2$), and the TCO layers are made of Indium Tin oxide.

7. The system of claim 1, wherein the first TCO contact layer, the HTL layer, the fused first and second perovskite layers, the ETL layer, and the second TCO contact layer are deposited on the first substrate, and placed in contact with the second substrate, wherein the second substrate caps the first TCO contact layer, the HTL layer, the fused first and second perovskite layers, the ETL layer, and the second TCO contact layer deposited on the first substrate.

8. A system comprising:
A first transparent conductive oxide (TCO) contact layer deposited at a first position in a semitransparent and uniform structure;
a hole transport (HTL) layer configured within the semitransparent and uniform structure, wherein the HTL layer is positioned on the first TCO contact layer, wherein the HTL layer includes oxides, or iodides or organic materials;
a first perovskite layer configured on the HTL layer, wherein the first perovskite layer is configured on the HTL oxide layer in the semitransparent and uniform structure;
a second perovskite layer positioned on the first perovskite layer;
an electron transport (ETL) layer positioned within the semitransparent and uniform structure, wherein the ETL layer is configured on the second perovskite layer and directly opposite to the HTL layer in the semitransparent and uniform structure, wherein the HTL layer includes oxides, or iodides or organic materials, wherein the ETL layer includes oxides or organic materials, and wherein an order of the HTL layer and ETL layer depositions can be reversed;
and
a second TCO contact layer deposited at a second position in the semitransparent and uniform structure on the ETL layer, wherein the first and second TCO contact layers, the HTL and ETL layers, and the first and second perovskite layers are configured on a first substrate, wherein a second substrate covers each layer positioned on the first substrate, wherein the first substrate, first TCO layer, HTL layer, first perovskite layer, second perovskite layer, ETL layer, second TCO layer, and second substrate collectively primarily absorb incident light from a solar spectrum, wherein the incident light primarily absorbed from the solar spectrum is converted to electrical power, wherein a transmission spectrum of the incident light will correspond to the solar spectrum and provide color neutral transmission and reflection of the incident light, wherein the first TCO contact layer, the HTL layer, the first perovskite layer, the second perovskite layer, the ETL layer, and the second TCO contact layer collectively act as an interference filter to primarily absorb incident light from the solar spectrum in a color neutral manner, and wherein the first and second substrate are sealed by laser glass-to-glass welding and/or polyisobutylene (PIB) sealing.

9. The system of claim 8, wherein the first and second TCO contact layers and the HTL and ETL layers provide a hermetic seal for the first perovskite layer and the second perovskite layer.

10. The system of claim 8, wherein the first and second TCO contact layers, the HTL and ETL layers, and the first and second perovskite layer provide color neutrality with transmission and reflection of the incident light and generate the electrical power from the incident light.

11. The system of claim 8, further comprising:
a plurality of outer window panes configured to prevent ultraviolet (UV) damage to the first and second TCO contact layers, the HTL and ETL layers, and the first and second perovskite layers.

12. The system of claim 8, wherein the HTL layer is made of copper iodide or spiro-OmeTAD, and the ETL layer is made of titanium oxide or PCBM.

13. The system of claim 8, wherein the first TCO contact layer, the HTL layer, the fused first and second perovskite layers, the ETL layer, and the second TCO contact layer are deposited on the second substrate, and wherein the first substrate caps the first and second TCO contact layers, the HTL and ETL layers, and the fused first and second perovskite layers deposited on the second substrate.

14. The system of claim 8, further comprising:
a plurality of gaps filled with argon and configured around the first perovskite layer and the second perovskite layer embedded in a solar cell, wherein the plurality of argon gaps are not configured within the solar cell in the semitransparent and uniform structure.

15. A method comprising:
positioning a first window pane at a first position in a semitransparent and uniform structure;
configuring a first substrate with a first transparent conductive oxide (TCO) contact layer, a hole transport (HTL) layer, and a first perovskite layer, a second perovskite layer, an electron transport layer (ETL), and a second TCO contact layer;
positioning a second substrate to cover the first TCO contact layer, the HTL layer, the first perovskite layer, the second perovskite layer, the ETL layer, and the second TCO contact layer, wherein the HTL layer includes oxides, or iodides or organic materials, wherein the ETL layer includes oxides or organic materials, wherein an order of the HTL and ETL layer depositions can be reversed, wherein the first and second substrate are positioned at a set distance away from the first window pane in the semitransparent and uniform structure,
wherein the first substrate, first TCO layer, HTL layer, first perovskite layer, second perovskite layer, ETL layer, second TCO layer, and second substrate collectively primarily absorb incident light from a solar spectrum, wherein the incident light primarily absorbed from the solar spectrum is converted to electrical power, wherein a transmission spectrum of the incident light will correspond to the solar spectrum and provide color neutral transmission and reflection of the incident light, and wherein the first TCO contact layer, the HTL layer, the first perovskite layer, the second perovskite layer, the ETL layer, and the second TCO contact layer collectively act as an interference filter to primarily absorb incident light from the solar spectrum in a color neutral manner; and
configuring a second window pane at a second position, wherein the second window pane is configured directly opposite to the first window pane, and around the first and second substrate in the semitransparent and uniform structure, and wherein the first and second substrate are sealed by laser glass-to-glass welding and/or polyisobutylene (PIB) sealing.

16. The method of claim 15, wherein the first and second TCO contact layers, the HTL layer, and the ETL layer provide a hermetic seal to protect the first perovskite layer and the second perovskite layer from outside humidity.

17. The method of claim 15, wherein the first and second TCO contact layers include fluorine doped tin oxide (FTO) and/or aluminum doped zinc oxide (AZO), the HTL oxide layer includes copper iodide or TIPS-pentacene, and the ETL layer includes zinc oxide or PCBM.

18. The method of claim 15, further comprising:
coating the first window pane and the second window pane to protect the first and second perovskite layer from ultraviolet (UV) damage.

19. The method of claim 15, further comprising:
providing color neutrality with transmission and reflection of incident light using the first and second TCO contact layers, the HTL layer, and the ETL layer with the first and second perovskite layer and generating electrical power from the incident light.

20. The method of claim 15, further comprising:
configuring one or more metal runners on the first and second substrate to assist in transferring a charge to one or more external contacts in the semitransparent and uniform structure.

* * * * *